United States Patent [19]

Franken et al.

[11] Patent Number: 4,868,384
[45] Date of Patent: Sep. 19, 1989

[54] ELECTRIC PRESSURE SWITCH

[75] Inventors: Josef Franken, Körnerstrasse 70, D-4040, Neuss; Silvia Jäger, Duisburg, both of Fed. Rep. of Germany

[73] Assignee: Josef Franken, Fed. Rep. of Germany

[21] Appl. No.: 228,375

[22] Filed: Aug. 4, 1988

[30] Foreign Application Priority Data

Aug. 4, 1987 [DE] Fed. Rep. of Germany ....... 3725777

[51] Int. Cl.$^4$ .............................................. G01D 5/34
[52] U.S. Cl. ................................... 250/229; 250/221; 362/95; 200/314
[58] Field of Search ....................... 250/221, 229, 239; 200/314; 341/31; 362/95

[56] References Cited

U.S. PATENT DOCUMENTS

| | | | |
|---|---|---|---|
| 3,761,919 | 9/1973 | Baumann | 341/31 |
| 3,906,222 | 9/1975 | Astier et al. | 250/229 |
| 4,049,964 | 9/1977 | Wuchinich et al. | 341/31 |
| 4,617,461 | 10/1986 | Subbarao et al. | 250/229 |

FOREIGN PATENT DOCUMENTS 2817192 10/1979 Fed. Rep. of Germany.
3214446 4/1987 Fed. Rep. of Germany.

OTHER PUBLICATIONS

Busch-Jaeger Elektro GmbH, "Wie Man Mit Lichtschaltern Wohnräume Schöner Macht", Dec. 1987, pp. 8-9.

Primary Examiner—David C. Nelms
Assistant Examiner—Khaled Shami
Attorney, Agent, or Firm—Ostrolenk, Faber, Gerb & Soffen

[57] ABSTRACT

A dust and water tight electric pressure switch that is highly visible, even in a smoke filled area, includes a lightguide disc disposed between a ring-like cover and a cylindrical housing disposed behind a slightly depressible flexible zone at the center of the disc. The flexible zone covers the open front end of the housing. The disc is constructed of a light-collecting polycarbonate and is formed with relatively small light radiating surface to produce high contrast at the latter. Disposed within the housing is a contactless switch arrangement including a plurality of so-called light barrier units arranged about a light source, and an actuator extending from the rear of the flexible zone. A light shield carried by the actuator controls the amount of light which impinges on the light barrier units as a function of the position of the actuator as determined by how much the flexible zone is depressed.

13 Claims, 1 Drawing Sheet

ELECTRIC PRESSURE SWITCH

BACKGROUND OF THE INVENTION

The present invention relates to electric pressure switches of the type that are often used by passengers for opening railway car doors.

In order to make these switches themselves or their function upon operation visible, it is known to provide the actuating means thereof with a window-shaped transparent cover consisting of plastic, behind which an incandescent bulb (pilot light) is disposed. This type of switch having a pilot light requires a continuous supply of electricity in order that the pilot light remains lighted. Should the electricity fail or the incandescent bulb burn out, these prior art switches can no longer be seen when they are located in poorly lighted areas. In the past, attempts were made to eliminate these drawbacks by covering the area around such a switch with phosphorescent paint. This solution is unsatisfactory because it presents health hazards to both people and animals and, furthermore, the amount of radiation energy which could be stored was relatively slight.

In addition prior art electric pressure switches of the type have mechanical switch means which are subject to relatively rapid wear and can be easily damaged intentionally. Attempts have been made to eliminate this disadvantage by utilizing capacitive and inductive switch means, but these switch means are subject to many disturbing factors, such as stray fields, electric shunting influenced by weather conditions, etc.

SUMMARY OF THE INVENTION

This invention avoids the foregoing problem by providing a pressure switch that includes a lightguide disc of transparent plastic having a zone which is flexible in the longitudinal plane. The disc is arranged between a cover having an opening for access to the flexible zone, and a cup-shaped lower housing part wherein a contactless switch and a light source are disposed. A switch actuator in the form of a light shield extends from the flexible zone into the housing so as to control the amount of light which reaches the switch as a function of the position of the flexible zone.

In this way, the electric pressure switch is not only protected against external influences and provided with practically wear-free actuation, but it is also clearly visible because of the lightguide disc. The latter is constructed in accordance with the principles of geometrical optics with regard to light refraction or total reflection upon passage of light from the optically denser plastic into the optically thinner air.

The light shield is an opaque portion of a tubular formation that extends rearward from the flexible zone of the lightguide disc being aligned with and receiving the front end of the light source so that the amount of light that impinges upon the photoswitch is controlled by the degree to which the flexible zone is deflected It is advantageous for the lightguide disc to have flat light-collecting surfaces, and an exposed light-radiating edge.

Since the flexible zone is integral with the remainder of the lightguide disc a switch which is developed in this fashion does not have a seam in the region thereof to which an operating force (pressure) is applied by the user, the switch is well protected against spray water and dust.

When there are special requirements with respect to the visibility of the switch, it is advantageous for the top of a circuit board which is arranged in the housing lower part and bears the electronic circuit elements, to be provided with light-emitting diodes.

OBJECTS OF THE INVENTION

The primary object of this invention is to provide a reliable highly visible electric pressure switch.

Another object is to provide an electric pressure switch of this type in which the switch actuator does not physically engage the switch operated thereby.

Still another object is to provide an electric pressure switch of this type that includes a lightguide disc constructed of a polycarbonate.

DETAILED DESCRIPTION OF THE DRAWINGS

Figure 1:
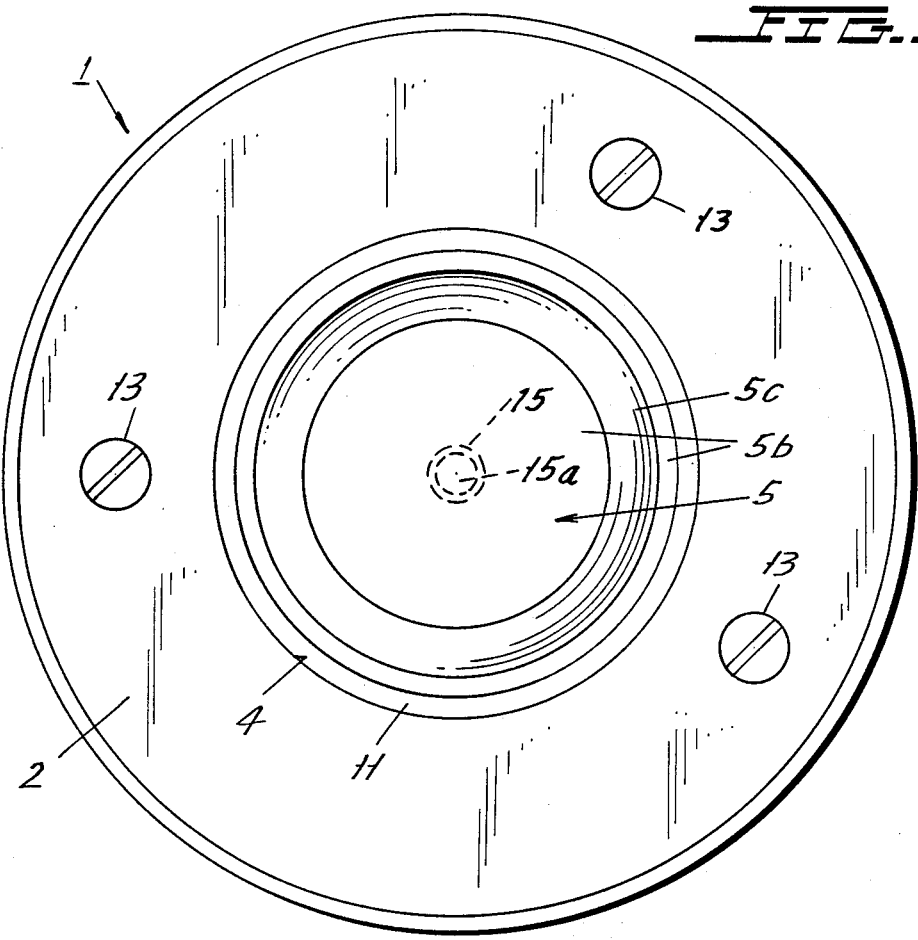
FIG. 1 is a top or front view of an electric pressure switch constructed in accordance with this invention.
Figure 2:
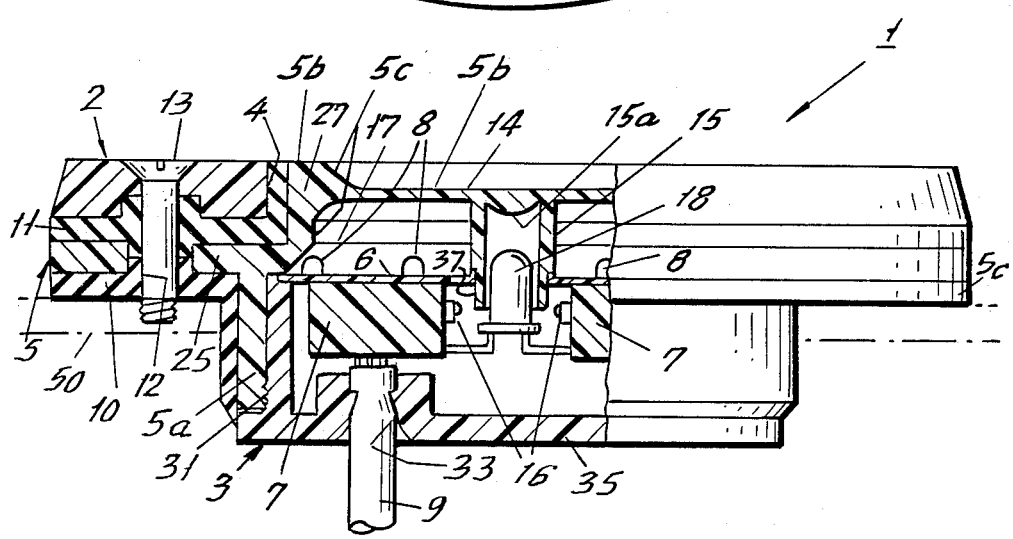
FIG. 2 is a partially sectioned side elevation of the electric pressure switch of FIG. 1.

The main structural elements of electric pressure switch 1 are ring-like cover 2, cup-shaped rear housing part 3, and lightguide disc 5. All of the elements 2, 3 and 5 are molded of plastic material, with disc 5 being transparent. Lightguide disc 5 includes ring-like peripheral portion 25 which surrounds thin rearwardly deflectable central zone 14 that is aligned with central opening 4 in cover 2. Zone 14 and peripheral portion 25 are in generally parallel planes with zone 14 being slightly forward of portion 25. Zone 14 is connected to the inner wall of stubby cylindrical projection 27 at the front of disc 5 and is slightly recessed in projection 27. Cylindrical projection 5a at the rear of peripheral portion 25 surrounds the cylindrical sidewall of housing 3 and is secured thereto by threaded connection 31.

Circuit board 6 is disposed within housing 3 and is seated on an internal ledge adjacent the open front of housing 3, being clamped in place by disc 5. A plurality of light emitting diodes 8 are mounted on the front of board 6 and a plurality of electric circuit modules 7 are mounted on the rear of board 6. Cable 9, containing power and control signal conductors, extends through aperture 33 in the otherwise closed rear surface 35 of housing 3 and is connected directly to at least one of the modules 7. A plurality of switches 16, such as light barrier units or photoswitches, or the like, are mounted on modules 7 in an array around the periphery of light source 16, in this case a light emitting diode The forward end of the latter projects through a central aperture in board 6 and into cylindrical switch actuator 15 through its open rear end. Actuator 15 projects rearward from the center of deflectable zone 14 and extends through the central aperture in circuit board 6 to a point where the opaque light shielding coating 37 interferes partially with light from source 18 impinging upon switches 16. Thus, the extent to which zone 14 is deflected rearward determines the amount of light that impinges upon switches 16. The elements are proportioned so that with a very slight deflection of zone 14, the change in the amount of light impinging upon switches 16 will cause the latter to perform a switching function to generate a signal that is fed through cable 9 to an external control circuit (not shown).

For purposes of shock absorption and vibration damping, and to seal housing 3 against the entry of water and dust, formed resilient gasket element 11 is interposed between the rear surface of cover 2 and the front surface of peripheral portion 25, and also between the interior edge of cover 2 and the exterior of projection 27. One portion of formed resilient gasket element 10 lies adjacent the outer surface of lightguide disc projection 5a, and another portion of element 10 is sandwiched between the rear surface of peripheral portion 25 and engages wall 50 on which electric pressure switch 2 is mounted. Three screws 13 extend through aligned apertures 12 in cover 2, gasket element 11, peripheral portion 25 of lightguide disc 5, and gasket element 10, to secure pressure switch 1 to wall 50.

Preferably, lightguide disc 5 is constructed of a light-collecting polycarbonate, such as the product sold under the name LISA by Bayer AG of Leverkusen, Federal Republic of Germany. Lightguide disc 5 has flat light-collecting surfaces 5b on which incident light is collected and conducted to light-radiating surfaces 5c, principally the exterior edge of peripheral portion 25. These light-collecting surfaces 5b are polished, in conform tradistinction to the dulled light-radiating edges 5c. For fluorescent radiation, the laws of geometrical optics apply with regard to light refraction and total reflection upon passage of light from the optically denser polycarbonate into the optically thinner air. For this reason, the shaping of lightguide disc 5 is selected so that the incident light can emerge only at limited regions, 5c. Since the incident quantity of light remains constant and is collected over relatively extensive surfaces 5b, but can exit again only on a relatively small surface area, an increase in contrast results Chamfer 17, disposed at a 45° angle with respect to both front surface 5b of extension 27 and outer edge 5c of disc 5, reflects light which enters disc 5 through front edge surface 5b of extension 27 to exit disc 5 through outer edge 5c thereof. In order to protect the light-collecting outside surfaces 5b from dirt it is advisable that they be dull and that the inside surfaces opposite surfaces 5b be polished Flexible zone 14 is about 0.4 to 0.7 mm thick. Central extension 15 of zone 14 and light shield 37 thereon cooperate with switches 16 to constitute a contactless actuating means.

The manner of action of this electric pressure switch 1 will be explained on the assumption that it is installed on a wall of a coach in a commuter train, to one side of a door opening in such wall. When the train enters a railway station, daylight, or artificial light provided at night, is sufficient to make switch 1 visible to travelers. Since collected light energy is given off by lightguide disc 5, the fluorescing color of the lightguide disc, depending on the color used, results in a sharp contrast effect. When the train stops, the engineer actuates a central switch by which the light source 18 is energized and emits radiation through zone 14, which radiation is to an extent concentrated at the center of zone 14 by optical lens formation 15a on the rear surface of zone 14, to illuminate switch 1 so that the passengers can recognize that it is now, so to speak, armed, so that the door can be opened by actuating electric pressure switch 1. If a passenger presses against the illuminated flexible zone 14 of the light disc 5, cylindrical extension 15 moves rearward a few tenths of a millimeter deeper into the housing lower part 3 and influences the amount of light impinging on switches 16. As a result of this action, a signal is given to activate a door opening device (not shown), which may be an electric, pneumatic or mechanical operating device As a return message to the passengers that the system has received the signal for the opening of the doors, light-emitting diodes 8 associated with the lightguide disc 5 are lighted upon actuation of switches 16.

In order that illumination from source 18 be particularly visible in the midst of large surrounding brightness, optical lens formation 15a which focuses light from source 18, is polished to a high gloss. Ease of recognition can be further increased by using blinking diodes instead of normal light emitting diodes 8.

Electric pressure switch 1 may also be used, as an emergency switch in buildings, in factories, for equipment, etc., since upon the occurrence of a power failure, say in the event of fire, a relatively small source of light, such as provided by a small flashlight, is sufficient to make electric pressure switch 1 visible to a person looking for it, even in the presence of smoke or fumes, so that switch 1 can be actuated without delay Although the present invention has been described in connection with a plurality of preferred embodiments thereof, many other variations and modifications will now become apparent to those skilled in the art. It is preferred, therefore, that the present invention be limited not by the specific disclosure herein, but only by the appended claims.

What is claimed is:

1. An electric pressure switch including:
   a cup shaped housing having an open front, switch means disposed within said housing, a ring-like cover, a lightguide disc including a peripheral portion disposed behind said cover and extending outboard of said housing, said disc also including a central region aligned with said housing and covering said open front;
   said peripheral portion including an exposed light radiating outer edge;
   said central region having a light collecting front facing surface;
   said central region on its rear side mounting a switch actuating formation;
   said central region being rearwardly deflectable to move said actuating formation rearward for operating said switch means.

2. An electric pressure switch as set forth in claim 1 in which said switch actuating formation and said switch means constitute portions of a contact-free actuating device.

3. An electric pressure switch as set forth in claim 2 in which the switch actuating formation and said central region are integrally formed.

4. An electric pressure switch as set forth in claim 1 in which the light radiating outer edge is provided with a dull finish and the front facing surface of the central region is more polished than said outer edge.

5. An electric pressure switch as set forth in claim 1 also including a circuit board disposed within said housing and having a front surface confronting said central region; and light emitting diodes disposed on said front surface.

6. An electric pressure switch as set forth in claim 1 also including a light source disposed within said housing in alignment with said formation and emitting light that normally impinges up said switch means; said formation being tubular and having an open rear end through which said light source is entered into said formation so that as said central region is deflected rearward the lesser amount of light from said source that impinges upon said switch means is varied thereby causing operation of the latter.

7. An electric pressure switch as set forth in claim 6 also including a light shield on said formation movable between said light source and said switch means to control the amount of light impinging on the latter as a function of the position of the central region 8. An electric pressure switch as set forth in claim 6 in which the rear side of the central region is provided with an optical lens formation aligned with said formation.

9. An electric pressure switch as set forth in claim 1 also including a shaped resilient ring interposed between the cover and the lightguide disc.

10. An electric pressure switch as set forth in claim 9 also including a resilient member adjacent said peripheral portion at its rear surface to be interposed between said peripheral portion and a surface on which said electric pressure switch is mounted.

11. An electric pressure switch as set forth in claim 10 in which the resilient member includes a rearwardly extending cuff that surrounds and is adjacent to a rearwardly extending cylindrical tubular formation extending rearward from said peripheral portion in the region of its inner boundary.

12. An electric pressure switch as set forth in claim 11 in which the housing includes a cylindrical sidewall that is disposed adjacent the inner surface of the cylindrical tubular formation that extends rearward from the peripheral portion.

13. An electric pressure switch as set forth in claim 1 in which the lightguide disc is colored with a fluorescing color pigment.

* * * * *